(12) United States Patent
Abdesselam et al.

(10) Patent No.: US 10,712,209 B2
(45) Date of Patent: Jul. 14, 2020

(54) MONITORING A FAULT IN AN ELECTRICAL EQUIPMENT ITEM

(71) Applicant: THALES, Courbevoie (FR)

(72) Inventors: Francis Abdesselam, Chatou (FR); Joël Devautour, Chatou (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/216,832

(22) Filed: Dec. 11, 2018

(65) Prior Publication Data

US 2019/0187006 A1 Jun. 20, 2019

(30) Foreign Application Priority Data

Dec. 14, 2017 (FR) ...................... 17 01307

(51) Int. Cl.
| | | |
|---|---|---|
| *G01K 7/18* | (2006.01) | |
| *G01F 1/692* | (2006.01) | |
| *H01C 3/12* | (2006.01) | |
| *H01C 17/075* | (2006.01) | |
| *G01R 31/14* | (2006.01) | |
| *G01K 7/16* | (2006.01) | |
| *G01K 3/00* | (2006.01) | |
| *G01K 7/00* | (2006.01) | |
| *H01C 7/00* | (2006.01) | |

(52) U.S. Cl.
CPC ............ *G01K 7/183* (2013.01); *G01F 1/692* (2013.01); *G01K 3/005* (2013.01); *G01K 7/00* (2013.01); *G01K 7/16* (2013.01); *G01R 31/14* (2013.01); *H01C 3/12* (2013.01); *H01C 7/006* (2013.01); *H01C 17/075* (2013.01); *H05B 2203/003* (2013.01)

(58) Field of Classification Search
CPC .......... G01K 7/183; G01F 1/692; H01C 3/12; H01C 17/075
See application file for complete search history.

(56) References Cited

U.S. PATENT DOCUMENTS

| | | | | |
|---|---|---|---|---|
| 3,801,949 | A * | 4/1974 | Larrabee ................. | H01C 7/04 338/22 R |
| 7,588,367 | B2 * | 9/2009 | Huetter .................. | G01K 7/028 374/10 |
| 7,956,381 | B1 * | 6/2011 | Brewer ................... | H01L 23/66 257/160 |
| 8,425,115 | B2 * | 4/2013 | Rahman ................... | G01K 7/16 257/467 |
| 9,490,003 | B2 * | 11/2016 | Shoemaker .............. | G01K 3/08 |
| 2004/0056321 | A1 | 3/2004 | Parsons | |
| 2007/0145362 | A1 * | 6/2007 | Wolkin .................. | H01C 7/006 257/43 |
| 2007/0147473 | A1 * | 6/2007 | Wolkin .................... | G01K 7/22 374/208 |
| 2007/0215973 | A1 | 9/2007 | Rahman et al. | |
| 2008/0002755 | A1 * | 1/2008 | Raravikar .............. | B82Y 15/00 374/100 |

* cited by examiner

*Primary Examiner* — Kyung S Lee
(74) *Attorney, Agent, or Firm* — Baker & Hostetler LLP

(57) ABSTRACT

The monitoring of an electrical equipment item includes two electrically insulated circuits, a screen in the form of a film arranged between the two circuits, the screen comprising a substrate and a conductive filament arranged on the substrate, a module configured to circulate a current in the conductive filament and to monitor the current.

13 Claims, 4 Drawing Sheets

MONITORING A FAULT IN AN ELECTRICAL EQUIPMENT ITEM

CROSS-REFERENCE TO RELATED APPLICATIONS

This application claims priority to foreign French patent application No. FR 1701307, filed on Dec. 14, 2017, the disclosures of which are incorporated by reference in their entirety.

FIELD OF THE INVENTION

The invention relates to the monitoring of an electrical equipment item. The appearance of a fault in an electrical equipment item can lead to critical consequences that should be monitored in order, if necessary, to take measures to avoid the critical consequences.

BACKGROUND

The invention addresses two main fault causes likely to occur in an electrical equipment item: the appearance of electrical arcs between two different potentials that can lead to the breaking of electrical insulation elements and the occurrence of overheating that can result in thermal runaway.

The occurrence of overheating can be detected by a temperature sensor. It can be a resistor with positive or negative temperature coefficient. The temperature sensor is linked to a circuit that can detect the exceeding of a maximum temperature not to be exceeded. If the temperature is exceeded, an alarm can be activated. It is also possible to cut the electrical power supply of all or part of the equipment item in order to eliminate the origin of the overheating.

The detection of an arc can be provided by monitoring a current circulating in the equipment item and in particular by the detection of high-frequency components appearing in the current. As for the overheating, the detection of an arc can be coupled with an alarm or with the breaking of the electrical power supply of the equipment item.

The invention proposes a simple means that allows for the monitoring of the appearance of electrical arcs and possibly the occurrence of overheating.

SUMMARY OF THE INVENTION

To this end, the subject of the invention is an electrical equipment item comprising:
two electrically insulated circuits,
a screen in the form of a film arranged between the two circuits, the screen comprising a substrate and a conductive filament arranged on the substrate,
a module configured to circulate a current in the conductive filament and to detect a breaking of the conductive filament through the stopping of the circulation of the current.

The module is advantageously configured to open a contactor if a current circulating in the filament is nil. The detection of the breaking of the filament can be done by checking whether a current circulating in the filament passes below a given threshold.

The contactor can ensure the electrical power supply of at least one of the circuits.

In a particular configuration of the invention, a first of the two circuits has a front-end surface, a second of the two circuits has a front-end surface, the two front-end surfaces facing one another. A common surface corresponding to the facing greater portion of the two front-end surfaces is defined. The dimensions of the surface of the screen are greater than those of the common surface.

The filament is advantageously formed in a resistive material with non-zero temperature coefficient. Thus, a filament resistance measurement allows for the detection of a fault in case of overheating of one of the circuits.

The filament winds advantageously regularly over the surface of the substrate. Thus, any fault, even local, can be detected.

Advantageously, the filament is formed by two separate electrical conductors. These two conductors notably allow for a redundancy in the event of a fault on one of the filaments.

Advantageously, the two electrical conductors cover substantially all of a useful surface of the screen. The useful surface is the smaller surface of convex outline of the screen surrounding the filament. Thus, any fault occurring in one of the facing circuits of the useful surface can be detected.

Advantageously, the two electrical conductors are arranged on the substrate so as to limit the surface by a turn formed by the filament. This configuration makes it possible to limit any antenna effect generated by the filament.

Advantageously, the screen forms an electrostatic screen between the two circuits.

In a particular configuration of the invention, each of the circuits is a winding, the equipment item forming a transformer.

In a configuration in which the equipment item forms a transformer, the screen is advantageously arranged parallel to a main direction of a magnetic field coupling the two windings. This limits an effect of electromagnetic coupling of the filament with the windings.

BRIEF DESCRIPTION OF THE DRAWINGS

The invention will be better understood and other advantages will become apparent on reading the detailed description of an embodiment given by way of example, the description being illustrated by the attached drawing in which:

FIGS. 4 and 5 separately represent two conductors forming the filament represented in FIGS. 3 and 3a;

DETAILED DESCRIPTION

In the interests of clarity, the same elements will bear the same references in the different figures.

Figure 1:
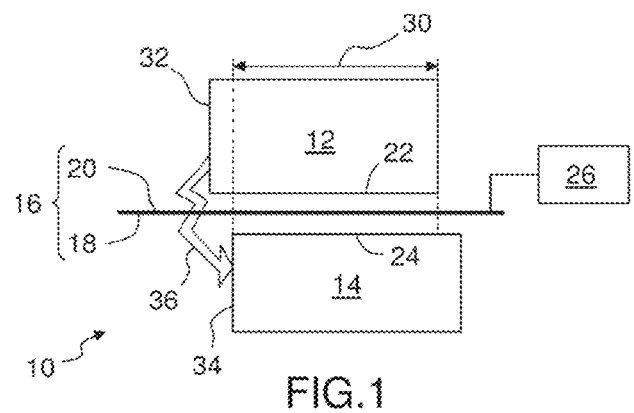
FIG. 1 schematically represents an equipment item according to the invention.

FIG. 1 represents an example of electrical equipment item 10 comprising two electrically insulated circuits 12 and 14. For the implementation of the invention, the two circuits 12 and 14 can ensure any type of function and can comprise any type of electrical or electronic component. One of the two circuits can be a simple electrical ground. The invention becomes useful as soon as a risk of overheating is likely to occur in at least one of the two circuits and/or a risk of electrical arc is likely to occur between the two circuits.

For the detection of a fault, the electrical equipment 10 comprises a screen 16 arranged between the two circuits 12 and 14. The screen 16 comprises an insulating substrate 18 and a conductive filament 20 arranged on the substrate 18. The two circuits 12 and 14 each have a so-called front-end surface, 22 for the circuit 12 and 24 for the circuit 14. The two front-end surfaces 22 and 24 face one another. The screen 16 has the form of a film that is interposed between the two front-end surfaces 22 and 24. The electrical equipment item 10 also comprises a module 26 configured to circulate a current in the filament 20 and to monitor this current.

It will be seen later how the monitoring of the current makes it possible to detect an overheating occurring in one of the circuits 12 or 14 or an arc occurring between the two circuits 12 and 14.

The two front-end surfaces 22 and 24 can have different dimensions. A common surface 30 is defined, corresponding to the facing greater portion of the two surfaces 22 and 24. The dimensions of the surface of the screen 16 can be less than those of the common surface 30. The screen 16 is then arranged facing zones of the circuits 12 and 14 where the risk of excessive overheating and/or of electrical arc exists. However, regarding the risk of electrical arc, these can occur between faces of the two circuits 12 and 14 other than the front-end faces 22 and 24. This risk is schematically represented in FIG. 1 where an arc 36 occurs between a lateral face 32 of the circuit 12 and a lateral face 34 of the circuit 14. Advantageously, the dimensions of the surface of the screen 16 are greater than those of the common surface 30 in order to allow for the detection of an arc occurring between the two front-end surfaces 22 and 24 and also between two other surfaces of the two circuits 12 and 14. In practice, when an arc 36 occurs between the two circuits, the screen 16 is pierced.

Figures 2, 2A:
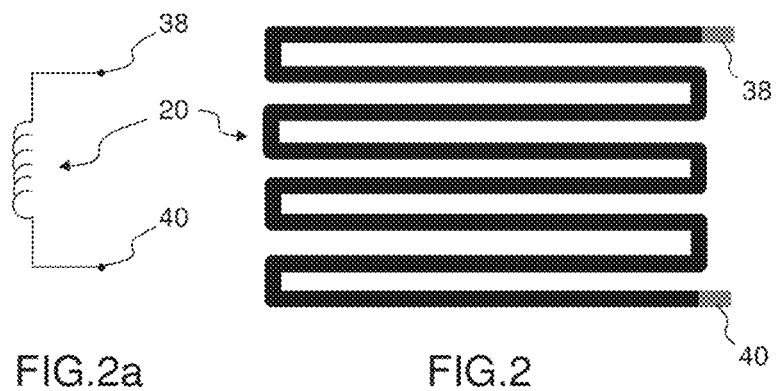
FIGS. 2 and 3 represent two variant embodiment of filaments with which a screen interposed between two electrical circuits of the equipment item of FIG. 1 is equipped.
FIGS. 2a and 3a each represent an equivalent circuit diagram of the filaments represented in FIGS. 2 and 3.

FIG. 2 represents a first variant embodiment of the filament 20 borne by the substrate 18, for example formed by a flexible film based for example on polyimide or on polyetherether ketone (PEEK).

The filament 20 is for example produced in a resistive material with non-zero temperature coefficient. This coefficient can be positive or negative. Thus, in the case of overheating of one of the circuits 12 or 14, the overheating is transmitted to the filament 20 by conduction and its resistance increases. By monitoring the current circulating in the filament 20, the module 26 can detect the overheating.

Moreover, an electrical arc occurring between the two circuits 12 and 14 will tend to pass through the screen 16 by perforating it. The detection of the arc can be made if the filament 20 is cut by the perforation of the screen 16. In-house tests have shown that, in the case of arc, holes measuring several $cm^2$ are observed in the screen 16. The filament 20 is therefore arranged on the substrate 18 at the point where a risk of arc exists.

Advantageously, the filament 20 winds regularly over a face of the substrate 18. Thus, the detection of a fault such as an arc or possibly an overheating can be met over all the surface of the screen 16. The width of the filament 20 and its distribution on the surface 18 is defined in such a way that an arc can cut the filament 20. In other words, the filament 20 must have a width that is sufficiently small to be able to be cut by an arc. In-house tests have shown that, upon the occurrence of an arc, the film 16 is perforated over at least 1 $cm^2$. With a width of filament 20 less than 5 mm and a distance between two adjacent filament strands also less than 5 mm, the breaking of the filament is almost certain when an arc occurs. FIG. 2a represents an equivalent circuit diagram of the filament 20 of FIG. 2. It is, here, a resistive component having two connection terminals 38 and 40 linked to the module 26.

The regular distribution of the filament 20 over the substrate 18 also allows the screen 16 to fulfil a function of electrostatic screen between the two circuits 12 and 14.

Figures 3, 3A:
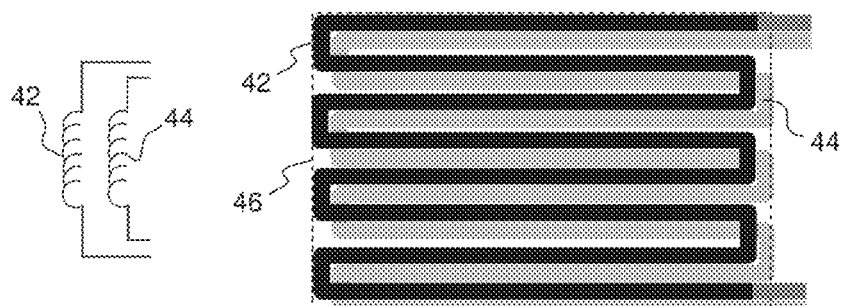

FIG. 3 represents a second variant embodiment of the filament 20 borne by the substrate 18. Here, the filament 20 is formed by the two electrical conductors 42 and 44 that can both be connected to the module 26. It is thus possible to ensure a redundancy of the filament 20. FIG. 3a represents an equivalent circuit diagram of the two conductors 42 and 44. It is of course possible to form the filament 20 with more than two distinct conductors.

Figure 4:
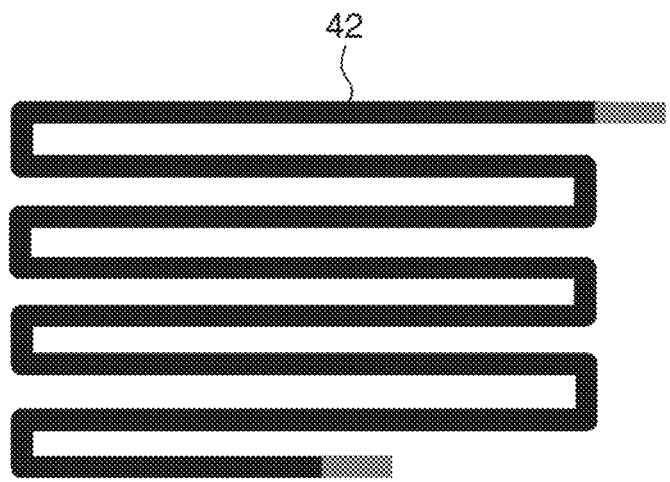
Figure 5:
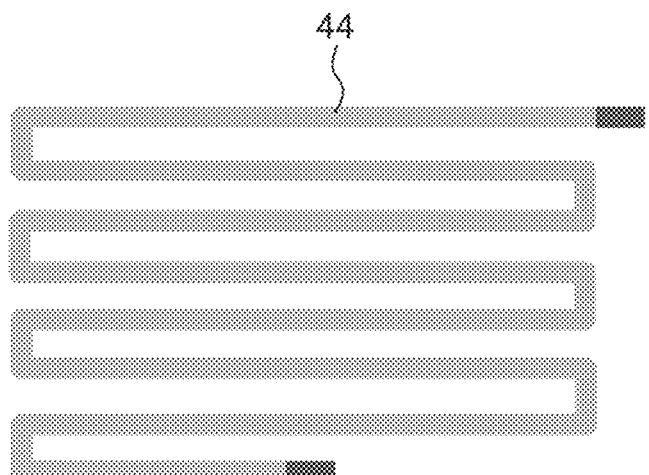

FIGS. 4 and 5 separately represent the two conductors 42 and 44 that can each be arranged on one of the faces of the substrate 18. The two conductors are advantageously dimensioned so that, by being superposed, each on its face, they both cover substantially all of a useful surface 46 of the screen 16 represented by dotted lines in FIG. 3. The useful surface 46 is the smaller surface of convex outline of the screen 16 surrounding the conductor or conductors 42 and 44 forming the filament 20. Thus, as soon as an arc passes through the screen 16 by perforating the useful surface 46, at least one of the two conductors 42 or 44 is damaged, which will modify its resistance. By monitoring the current circulating into the conductors 42 or 44, it is then possible to detect an arc by comparing the current circulating into the conductors 42 and 44 to a predetermined threshold. Below this threshold, it can be considered that an arc has occurred. In most cases of the occurrence of an arc, at least one of the two conductors 42 or 44 is cut.

More specifically, the useful surface 46 is a closed surface of the screen 16 in which the detection of the faults can be made. The substrate 18 can be larger than the useful surface 46, in particular so as to ensure the electrical insulation of the two conductors 42 and 44 relative to one another and in order to ensure the electrical connections of the conductors 42 and 44 to the module 26. To cover all of the useful surface 46, each of the two conductors 42 and 44 occupies at least half of the useful surface 46. The two conductors 42 and 44 are formed by tracks printed on the substrate 18. The two conductors 42 and 44 advantageously have a track width that is substantially constant over all their length. The conductors 42 and 44 can overlap.

The fact that the conductors 42 or 44 occupy all of the useful surface 46 also makes it possible to improve the possibility of detecting an overheating.

To fulfil the electrostatic screen function, it is not necessary for the filament 20, formed here by the two conductors 42 and 44, to cover all of the useful surface 46 of the screen 16. Zones that are not covered can remain. The arrangement of the conductors 42 and 44 is defined as a function of the maximum frequency that the screen 16 can protect in its electrostatic screening function.

Figures 6, 6A:
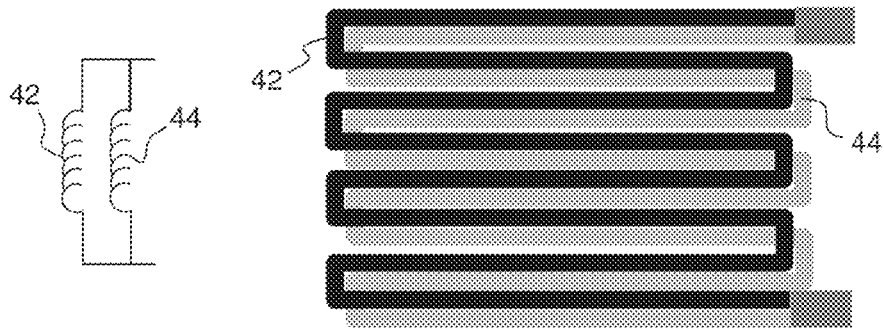
FIGS. 6 and 7 represent two variant connections of two conductors forming the filament of FIG. 3.
FIGS. 6a and 7a each represent an equivalent circuit diagram of the variant connections of FIGS. 6 and 7.

FIG. 6 represents a first variant connection of two conductors 42 and 44. In this variant, the two conductors 42 and 44 are connected in parallel. FIG. 6a represents an equivalent circuit diagram of the variant of FIG. 6. The parallel connection of the two conductors 42 and 44 makes it possible to ensure redundancy in the operation of the filament 20.

Figures 7, 7A:
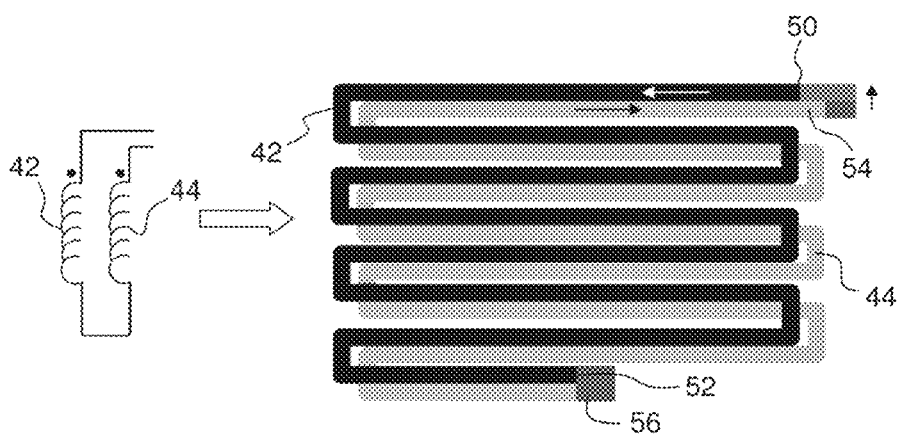

FIG. 7 represents a second variant connection of two conductors 42 and 44 in which the two conductors 42 and 44 are connected in series. FIG. 7a represents an equivalent circuit diagram of the variant of FIG. 7. The two electrical conductors 42 and 44 are arranged on the substrate 18 so as to limit the surface by a turn formed by the filament 20. In other words, the arrangement of the conductors 42 and 44 on the substrate 18 makes it possible to limit the inductance of the filament 20. More specifically, the conductor 42 extends between two ends 50 and 52. Likewise, the conductor 44 extends between two ends 54 and 56. The series connection of the conductors 42 and 44 is produced by connecting the ends 52 and 56. Moreover, the ends 50 and 54 are arranged as close as possible to one another to form the terminals of the filament 20 connected to the module 26. Between their respective ends, the two conductors 42 and 44 wind by following the same form, one on one of the faces of the substrate 18 and the other on the other face. A slight offset is produced between the two conductors 42 and 44 in order to cover all of a useful surface 46. It is possible to configure the conductors 42 and 44 in order for them to overlap even partly all along their run between their respective ends.

Figure 8:
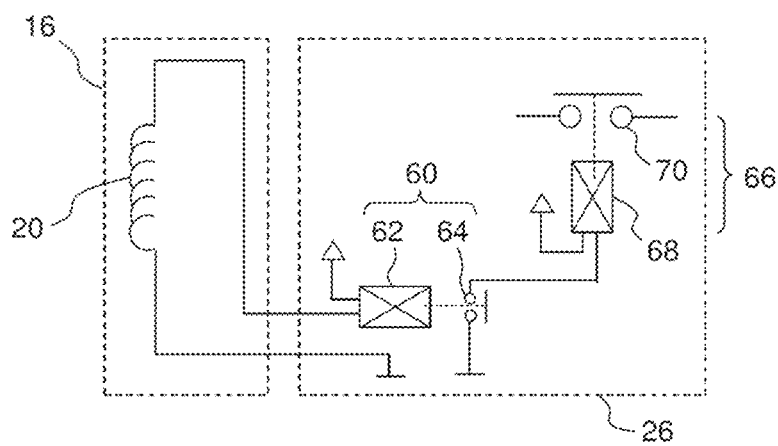
FIG. 8 represents an example of a module connected to the screen.

FIG. 8 represents an example of a module 26 connected to the screen 16. The filament 20 is supplied with direct voltage. The module 26 comprises a relay 60 having a coil 62 capable of tripping a contactor 64. The filament 20 and the coil 62 are connected in series. When a nominal current circulates in the filament 20 and in the coil 62, the contactor 64 is in a first state, for example closed. When the intensity of the current passes below a predetermined threshold, the contactor 64 switches to a second state, for example open. The two states of the contactor can of course be reversed. The reduction of the current can be due to the breaking of the filament 20, for example when an electrical arc passes through the screen 16. The predetermined threshold is representative of a breaking of the filament 20. In practice, the predetermined threshold is set at an intensity value that is low enough for, in nominal operation, the intensity of the current circulating in the filament to still be greater than the given value.

The reduction of the current can also be due to an excessive increase in temperature of the screen 16. As indicated previously, the filament 20 can be formed by means of a resistive conductor with positive temperature coefficient. When the temperature of the screen 16 increases, the resistance of the filament 20 increases and the current which circulates therein decreases, which can provoke an alarm or a change of status of the contactor 64. The relay 60 is then calibrated so as to change state when the intensity of the current circulating in the filament drops below a second predetermined threshold greater than the threshold for detection of breaking of the filament 20. Thus, in case of overheating, it is possible either to implement an alarm or to make the relay 60 switch over.

The module 26 can comprise a second relay 66 arranged downstream of the first relay. More specifically, the contactor 64 makes it possible to power a coil 68 of the second relay 66 which in turn changes the state of a contactor 70 of the second relay 66. The placement of the second relay 66 makes it possible, if need be, to put in place a contactor 70 allowing the passage of a higher nominal current than for the contactor 64.

The contactor 64 or, when present, the contactor 70, can be placed in a power supply circuit of one of the circuits 12 or 14 or in a power supply circuit of the two circuits 12 and 14. In case of a fault increasing the resistance of the filament 20, in particular when the filament 20 is cut, the power supply of the circuit concerned is interrupted, which makes it possible to eliminate the cause of the fault. In case of an electrical arc between the two circuits 12 and 14, detected by breaking of the filament 20, the power supply of one of the circuits is immediately cut. Alternatively, the contactor 64 can trip an alarm allowing other types of operations on one of the circuits 12 or 14.

Other embodiments of the module 26 are possible. It is for example possible to include a comparator therein to compare the current circulating in the filament 20 or the voltage present at its terminals to a reference, even to several reference currents or voltages. The output of the comparator then delivers an item of information on the presence or not of a fault. As previously, this item of information can be used to cut the power supply of one of the circuits 12 or 14, even of both.

Figure 9:
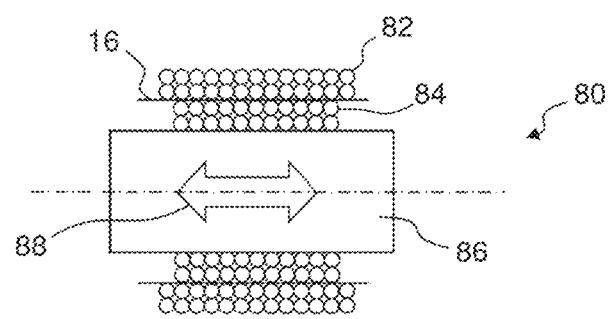
FIG. 9 represents a transformer implementing the invention.

FIG. 9 represents a transformer 80 implementing the invention. The transformer 80 comprises two windings 82 and 84 that are electrically insulated and magnetically coupled. Each of the windings 82 and 84 forms an exemplary embodiment of one of the circuits 12 and 14 described previously. The windings 82 and 84 are separated by the screen 16 thus making it possible to detect an overheating in one of the windings or an electrical arc occurring between the two windings 82 and 84.

In the example represented, the two windings 82 and 84 are wound around a magnetic core 86. The two windings 82 and 84 are, for example, wound concentrically around the magnetic core 86. The screen 16 surrounds the winding 84 and is arranged inside the winding 82. In this concentric configuration of the two windings 82 and 84, the screen 16 is arranged parallel to a main direction 88 of the magnetic field coupling the two windings 82 and 84. Thus, even if the screen 16 forms a current loop, the latter is not, or is very weakly, passed through by the magnetic field of the transformer 80.

The invention claimed is:

1. An electrical equipment item comprising:
    two electrically insulated circuits,
    a screen in the form of a film arranged between the two circuits, the screen comprising a substrate and a conductive filament arranged on the substrate,
    a module configured to circulate a current in the conductive filament and to detect a breaking of the conductive filament through the stopping of the circulation of the current.

2. The electrical equipment item according to claim 1, in which the module is configured to open a contactor if a current circulating in the filament is nil.

3. The electrical equipment item according to claim 2, in which the contactor ensures the electrical power supply of at least one of the circuits.

4. The electrical equipment item according to claim 2, wherein the module is configured to open the contactor if a current circulating in the filament passes below a given threshold.

5. The electrical equipment item according to claim 1, wherein a first of the two circuits has a front-end surface, a second of the two circuits has a front-end surface, the two front-end surfaces facing one another, in which there is defined a common surface corresponding to the facing greater portion of the two front-end surfaces, and in which the dimensions of the surface of the screen are greater than those of the common surface.

6. The electrical equipment item according to claim 1, wherein the filament is formed in a resistive material with non-zero temperature coefficient.

7. The electrical equipment item according to claim 1, wherein the filament winds regularly over the surface of the substrate.

8. The electrical equipment item according to claim 1, wherein the filament is formed by two separate electrical conductors.

9. The electrical equipment item according to claim 8, wherein the two electrical conductors cover substantially all of a useful surface of the screen, the useful surface being the smaller surface of convex outline of the screen surrounding the filament.

10. The electrical equipment item according to claim 8, wherein the two electrical conductors are arranged on the substrate so as to limit the surface by a turn formed by the filament.

11. The electrical equipment item according to claim 1, wherein the screen forms an electrostatic screen between the two circuits.

12. The electrical equipment item according to claim 1, wherein each of the circuits is a winding, the equipment item forming a transformer.

13. The electrical equipment item according to claim 12, wherein the screen is arranged parallel to a main direction of a magnetic field coupling the two windings.

* * * * *